(12) United States Patent
Wu

(10) Patent No.: US 6,937,477 B2
(45) Date of Patent: Aug. 30, 2005

(54) STRUCTURE OF GOLD FINGERS

(75) Inventor: Kai-Chiang Wu, Hsin Chu (TW)

(73) Assignee: Global Advanced Packaging Technology H.K. Limited, Kowloon (HK)

( * ) Notice: Subject to any disclaimer, the term of this patent is extended or adjusted under 35 U.S.C. 154(b) by 0 days.

(21) Appl. No.: 10/760,356

(22) Filed: Jan. 21, 2004

(65) Prior Publication Data

US 2005/0156303 A1 Jul. 21, 2005

(51) Int. Cl.⁷ .............................. H05K 7/02; H05K 1/11
(52) U.S. Cl. ...................... 361/760; 361/772; 361/777; 257/686; 257/786; 174/261
(58) Field of Search .............................. 361/735, 745, 361/770, 790, 776, 758, 777, 748, 760, 779, 361/783; 174/250, 261, 255–258, 263, 267; 257/686, 692, E25.013, 777, 779, 784, 786

(56) References Cited

U.S. PATENT DOCUMENTS

| | | | |
|---|---|---|---|
| 4,996,629 A | * | 2/1991 | Christiansen et al. ....... 361/783 |
| 5,323,060 A | * | 6/1994 | Fogal et al. ................. 257/777 |
| 6,005,778 A | * | 12/1999 | Spielberger et al. ........ 361/770 |
| 6,351,028 B1 | * | 2/2002 | Akram ........................ 257/686 |
| 6,356,452 B1 | * | 3/2002 | Rumsey ...................... 361/760 |
| 6,359,340 B1 | * | 3/2002 | Lin et al. .................... 257/777 |
| 6,407,456 B1 | * | 6/2002 | Ball ............................ 257/777 |
| 6,555,902 B2 | * | 4/2003 | Lo et al. ..................... 257/686 |
| 6,590,662 B2 | * | 7/2003 | Kokuryo et al. ............ 356/445 |
| 6,650,009 B2 | * | 11/2003 | Her et al. ................... 257/686 |
| 6,730,543 B2 | * | 5/2004 | Akram ........................ 438/109 |
| 6,740,970 B2 | * | 5/2004 | Hiraoka et al. ............. 257/723 |
| 6,777,797 B2 | * | 8/2004 | Egawa ........................ 257/686 |

* cited by examiner

Primary Examiner—Kahand Cuneo
Assistant Examiner—Dameon E. Levi
(74) Attorney, Agent, or Firm—Rosenberg, Klein & Lee

(57) ABSTRACT

The present invention provides an improved structure of gold fingers, which is to redesign a conventional gold finger on a packaging substrate into a gold finger set that contains a plurality of gold finger units. Between each single gold finger unit, there exists an electrical connection. Therefore, in the structure of stacked-chip packaging, each wire that is connected through wire bonding on the same gold finger of each layer chip can separately perform wire bonding on different gold finger units of the same gold finger set. Due to the improvement on the gold finger structure, the present invention can prevent the adhesive on a chip from flowing along the wire bonding path of a layer chip and smearing the whole gold finger. Thus, other layer chips can be prevented from being unable to perform wire bonding.

5 Claims, 9 Drawing Sheets

US 6,937,477 B2

STRUCTURE OF GOLD FINGERS

BACKGROUND OF THE INVENTION

1. Field of the Invention

The present invention relates to an improved structure of gold fingers and, more particularly, to an improved structure of gold fingers applied to a stacked-chip packaging structure.

2. Description of the Prior Art

The technique of multi-chip packaging, which involves the technique of stacking multiple chips and packaging them as an integrated circuit, has been widely adopted in the markets of memory packaging for mobile phones. FIG. 1 is a schematic diagram illustrating the structure of stacked-chip packaging. As shown in FIG. 1, a lower layer chip 12 and an upper layer chip 14 are provided on a packaging substrate 10. The lower layer chip 12 is bonded on the packaging substrate 10 by using a lower adhesive 16, whereas the upper layer chip 14 is bonded on the lower layer chip 12 by an upper adhesive 18. In addition, the lower layer chip 12 and the upper layer chip 14 are electrically connected to a gold finger 24 separately by means of a lower layer wire 22 and an upper layer wire 20 respectively.

Also, referring to FIG. 2, a groove 26 is set at the side of the lower adhesive 16 to impede outflow of the adhesive because it may flow along the packaging substrate 10. Nevertheless, the upper adhesive 18 can still flow along the lower layer wire 22 and eventually overflow all over the gold finger 24. If so, the upper layer wire 20 will have difficulty to perform wire bonding on the gold finger 24.

Moreover, as shown in FIG. 3, if the position of wire bonding from the lower layer wire 22 to the gold finger 24 is shifted, the upper layer wire 20 will also have difficulty to perform wire bonding on the gold finger 24 due to lack of enough space for doing it. Or the situation may be that the lower layer chip 12 is equal to or smaller than the upper layer chip 14 in size, as shown in FIG. 4. In such case, it will be even more difficult to reprocess wire bonding from the lower layer wire 22 to the gold finger 24 for solving the position shift problem.

In view of the above-mentioned problems encountered by the prior art, the present invention provides an improved structure of gold fingers to cope with the problems.

SUMMARY OF THE INVENTION

The primary object of the present invention is to provide an improved structure of gold fingers, and through the improvement, it is possible that in the structure of stacked-chip packaging, each wire that can be directly connected to one another on each layer chip can be separately connected to different gold finger units that belong to the same gold finger set.

Another object of the present invention is to provide an improved structure of gold fingers, so that in the structure of stacked-chip packaging, smearing of a whole gold finger caused by the adhesive's flowing along the wire-bonding path of a layer can be avoided, and therefore the consequence of smearing, resulted in as such that no chips on the other layers can perform wire bonding, can then be avoided as well.

Another object of the present invention is to provide an improved structure of gold fingers, so that in the structure of stacked-chip packaging, the position shift that occurs when a layer chip is performing wire bonding on a gold finger can be avoided, and therefore the consequence of position shift, resulted in as such that no chips on the other layers can perform wire bonding, can then be avoided as well.

According to the present invention, an improved structure of gold fingers includes a plurality of gold finger sets built on a packaging substrate and located on the periphery of a stack-chip packaging structure. Each gold finger set has a plurality of gold finger units, and there is an electrical connection between each gold finger unit. Therefore, on each layer chip of the stacked-chip packaging structure, the wire that can be directly connected to one another can be separately wire bonded to different gold finger units of the same gold finger set. By doing so, the problem of adhesive smearing that occurs when each wire is wire bonded to the same gold finger and the problem of position shift during wire bonding can be avoided.

The objects and technical contents of the present invention will be better understood through the description of the following embodiments with reference to the drawings.

DETAILED DESCRIPTION OF THE PREFERRED EMBODIMENTS

Figure 1:
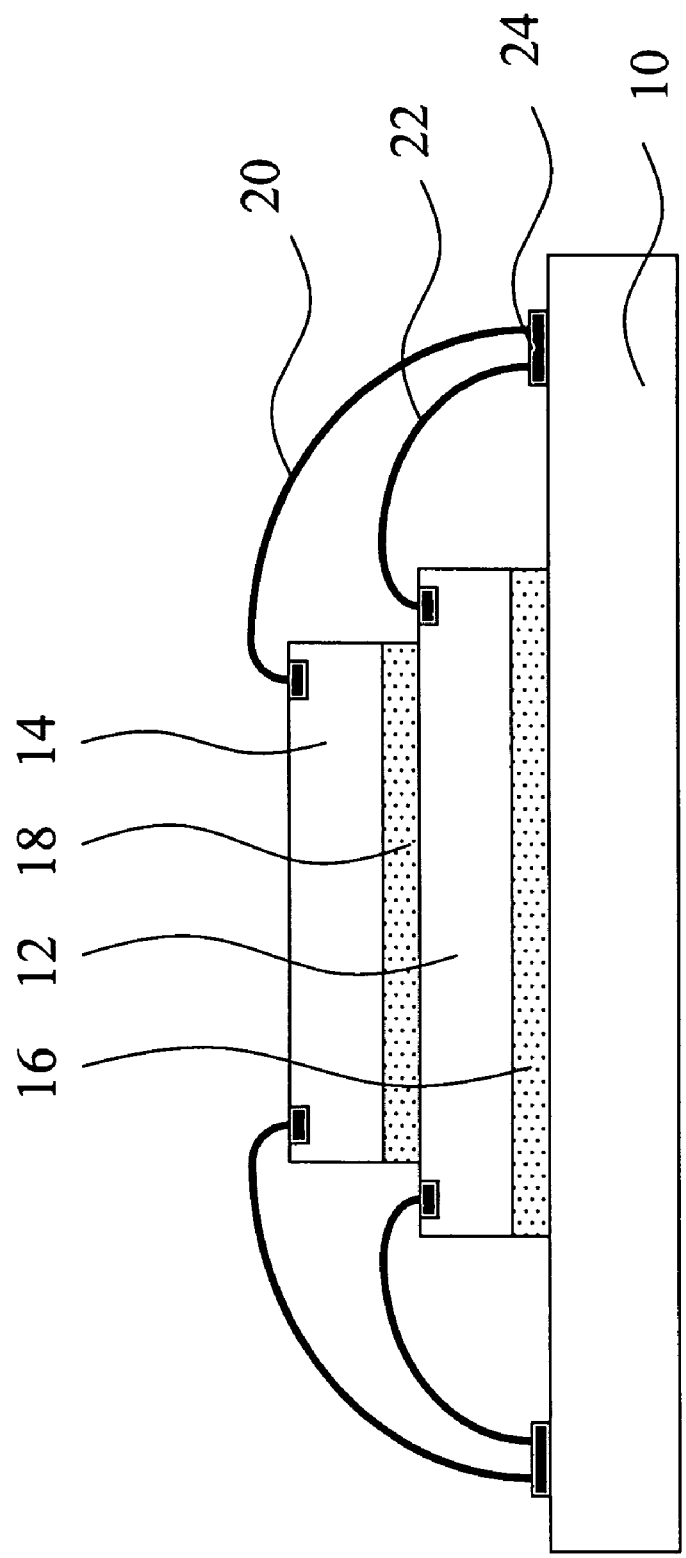
FIG. 1 is a schematic diagram showing the structure of conventional stacked-chip packaging.
Figure 2:
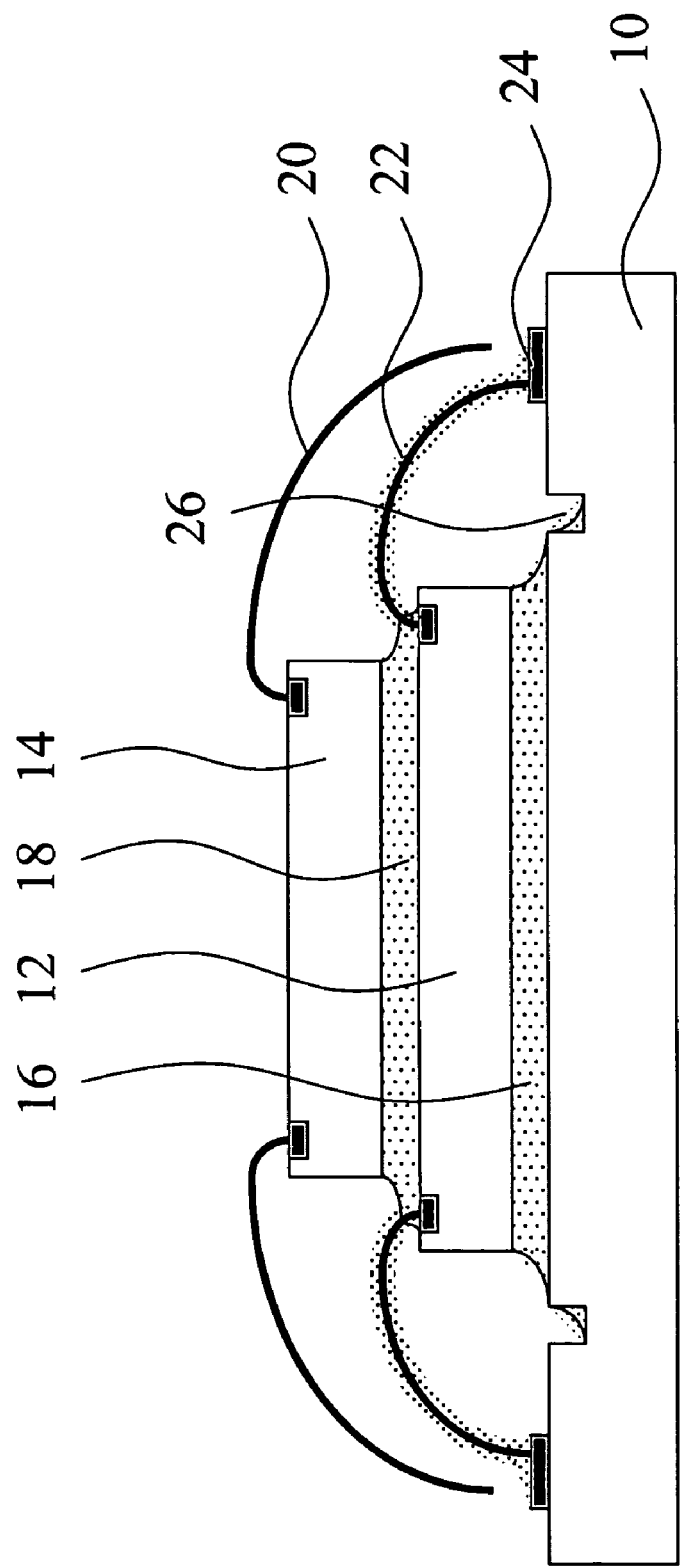
FIG. 2 is a schematic diagram showing the problem of adhesive's overflow encountered in the structure of conventional stacked-chip packaging.
Figure 3:
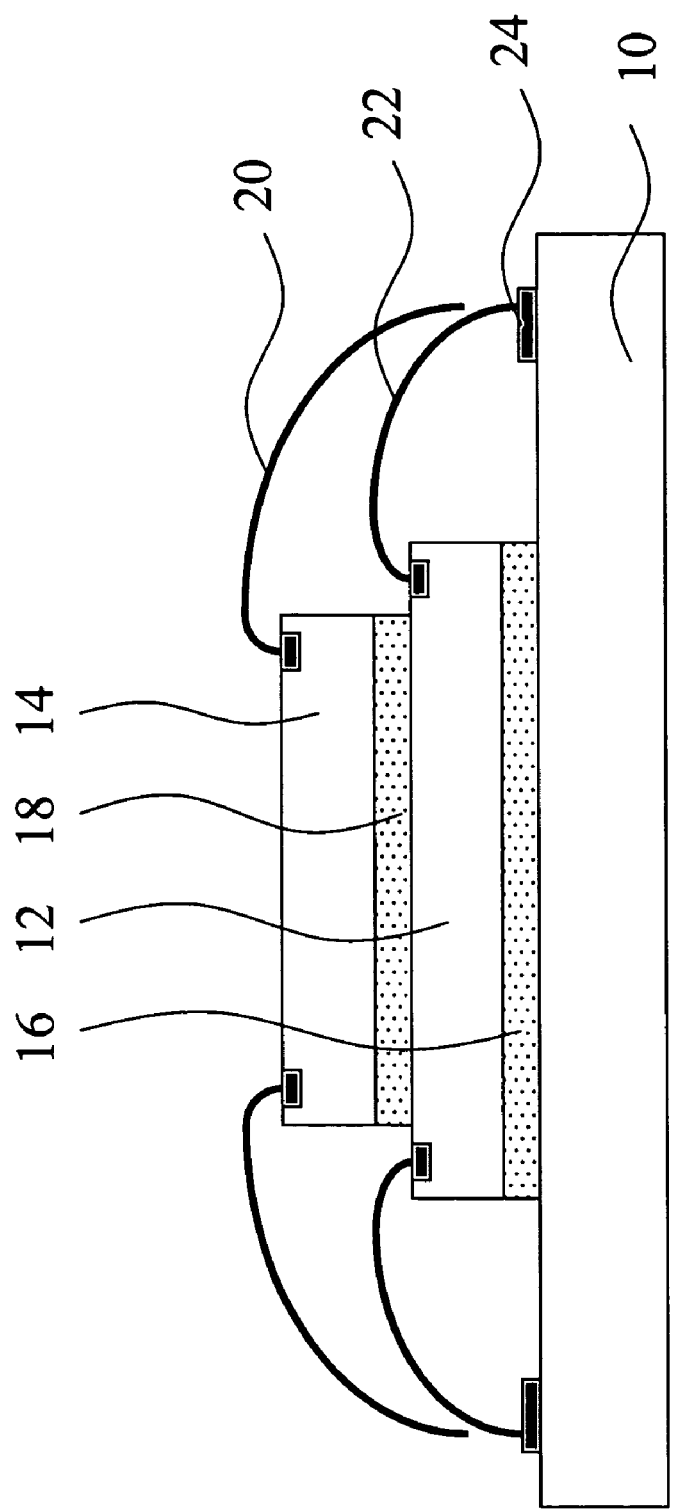
FIG. 3 and FIG. 4 are schematic diagrams showing the problem of position shift of wire bonding encountered in the structure of conventional stacked-chip packaging.
Figure 4:
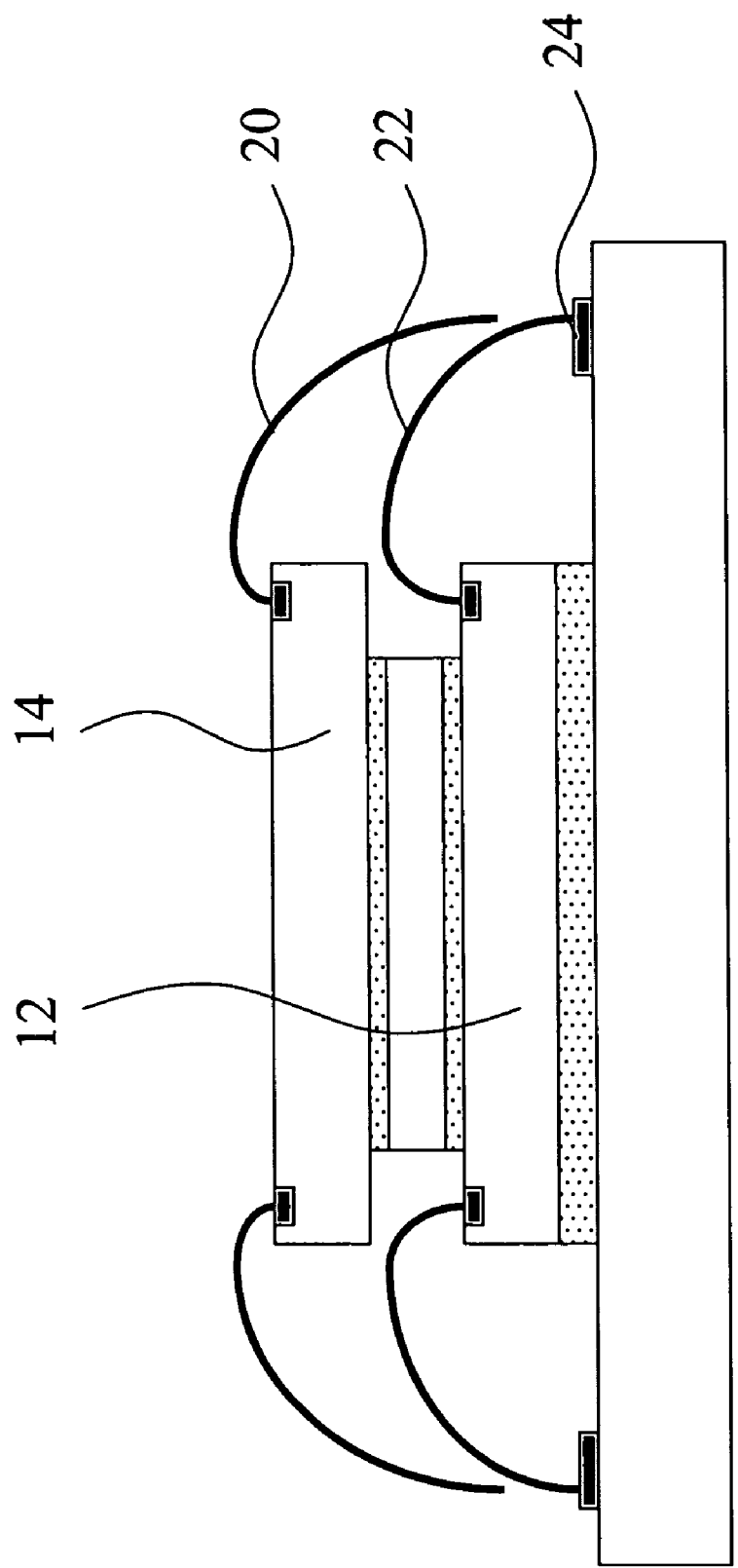
Figure 5:
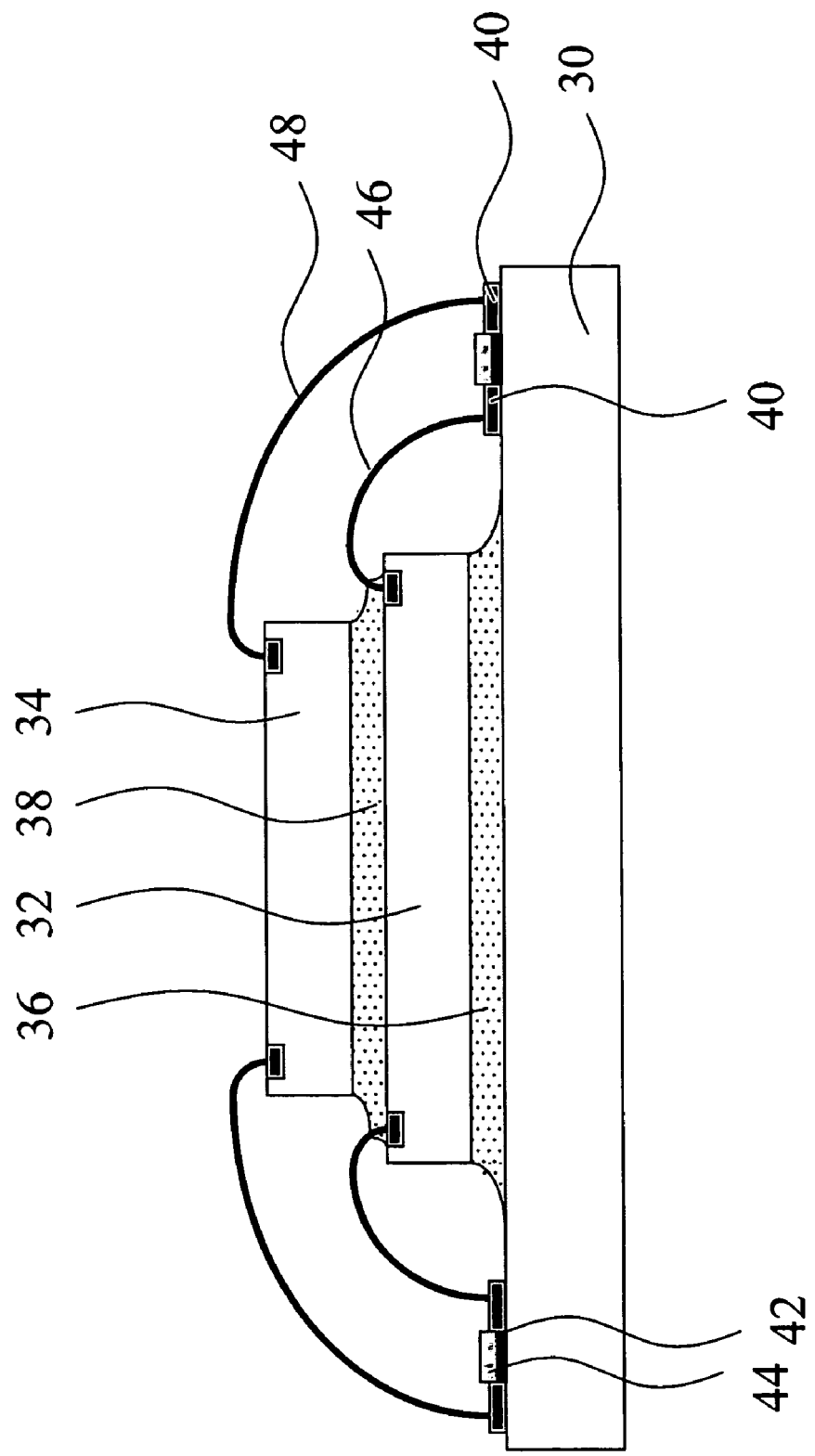
FIG. 5 and FIG. 6 are sectional view and top view respectively showing an embodiment of the present invention.
Figure 6:
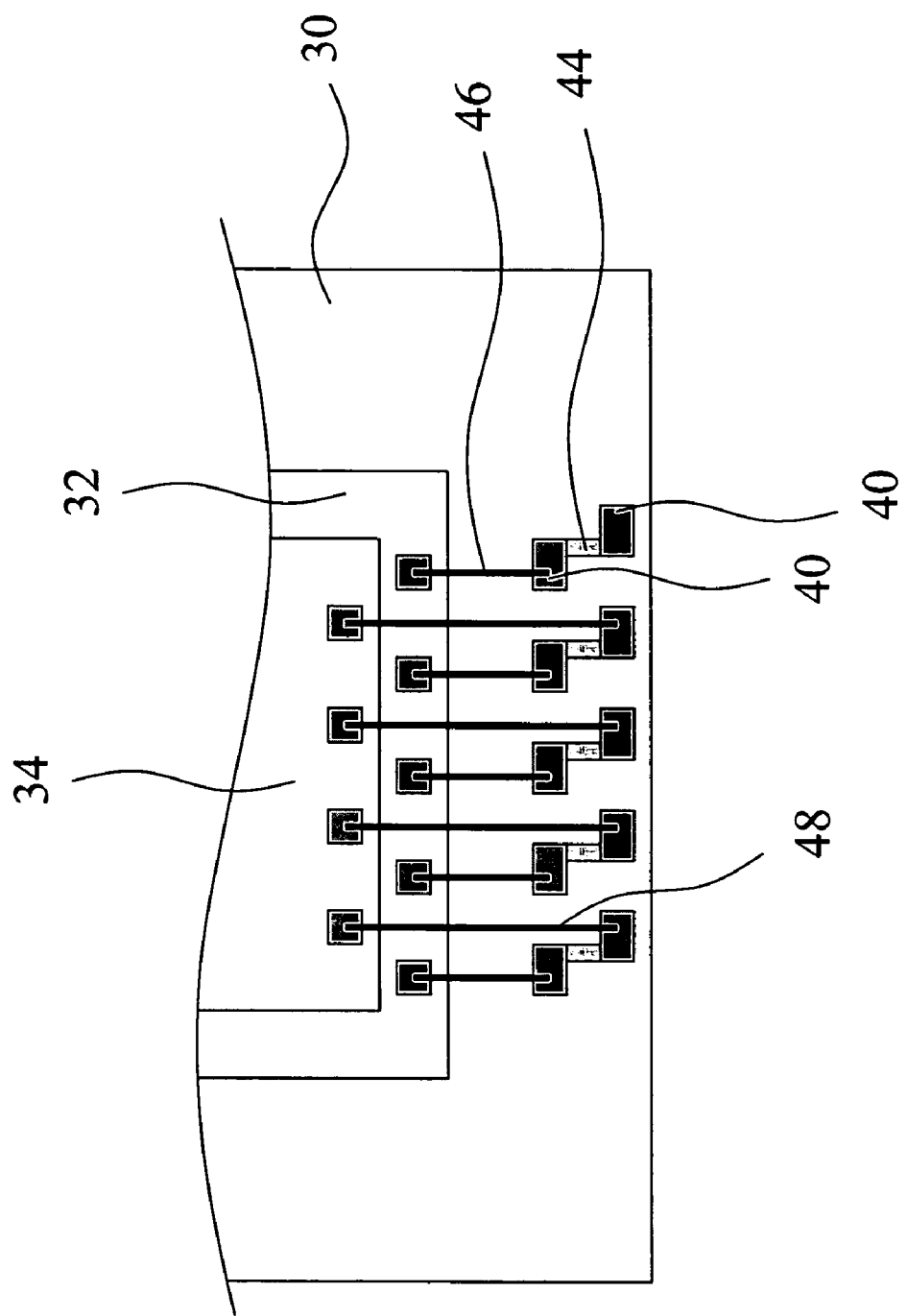
Figure 7:
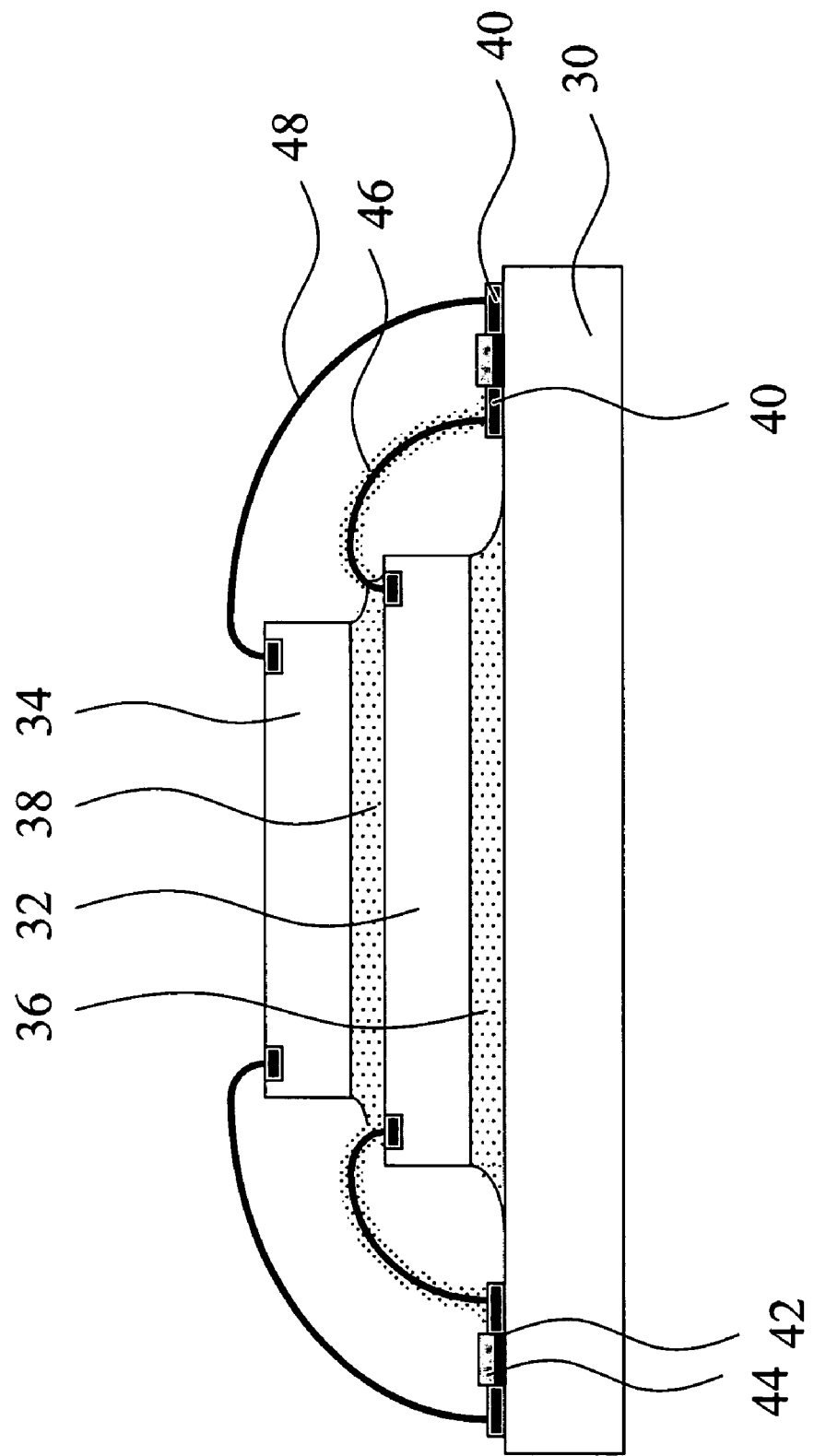
FIG. 7 is a schematic diagram showing that the adhesive's smearing on each gold finger unit can be avoided in the present invention.

FIG. 5 and FIG. 6 are sectional view and top view respectively showing an embodiment of the present invention. As shown in both Figures, a stacked-chip packaging structure is built on a packaging substrate 30. The structure of stacked-chip packaging includes a lower layer chip 32 and an upper layer chip 34. The lower layer chip 32 is bonded on the packaging substrate 30 by using a lower layer adhesive 36, whereas the upper layer chip 34 is bonded on the lower layer chip 32 by using an upper layer adhesive 38. In addition, a plurality of gold finger sets is also included, wherein each set of gold fingers has two gold finger units 40, and a wire 42 is used to electrically connect the two gold finger units 40. Moreover, a solder resist layer 44 is to cover the wire 42 so as to provide a solder-resist effect to the wire 42 as well as prevent the two gold finger units 40 from being smeared by the upper layer adhesive 38 or the lower layer adhesive 36. Therefore, referring to FIG. 7, when the lower layer wire 46 is connected to the gold finger unit 40 located at the inner side of the packaging substrate 30, the upper layer wire 48 can be connected to the gold finger unit 40 located at the outer side. For this reason, if the upper layer adhesive 38 flows along the lower layer wire 46 and smears the gold finger unit 40 at the inner side, the gold finger unit 40 at the outer side will not be smeared, resulting in the consequence of the upper layer wire 48's being unable to perform the wire bonding. Besides, a convex block or a concave groove can be provided at the outer side of the lower layer adhesive 36 to prevent the outflow problem made by the lower layer adhesive 36.

Figure 8:
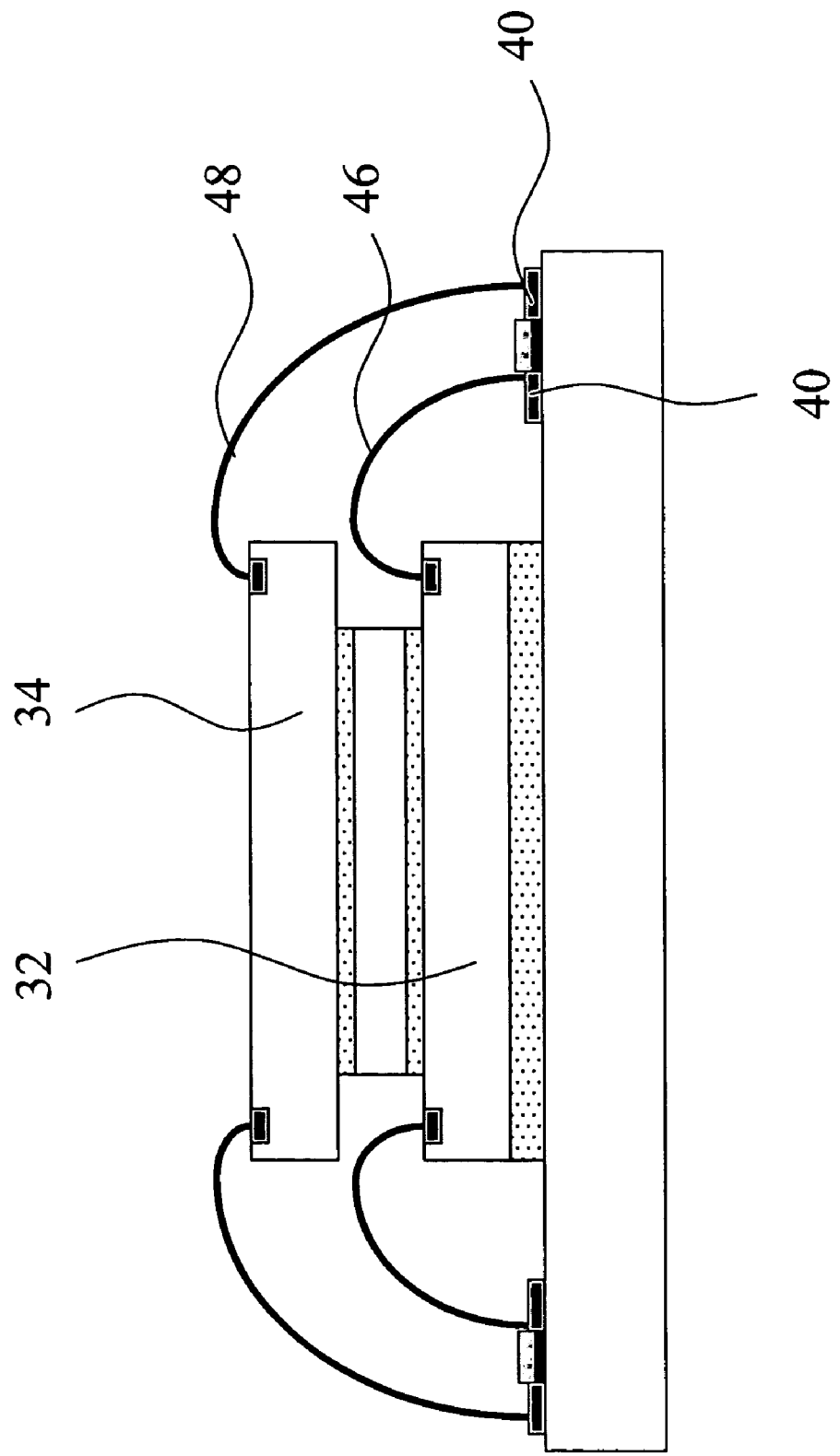
FIG. 8 and FIG. 9 are schematic diagrams showing other embodiments of the present invention.

Also, referring to FIG. 8, in the stacked-chip packaging structure where the upper layer chip 34 has the same size as the lower layer chip 32, when the lower layer wire 46 at the inner side of the gold finger unit 40 is making a position shift outwardly, the present invention can be applied and the upper layer wire 48 can then be smoothly connected to the gold finger unit 40 at the outer side. By doing so, not only can the tolerance level of the wire boning processing be increased, but the lower layer wire 46 can also be free from the reprocessing problem if the lower and the upper layer chips 32 and 34 have the same size. Also, aside from being applied to the same size chips, the present invention can also be applied to the stacked-chip packaging structure containing chips in different sizes in order to solve the position shift problem of wire bonding.

Figure 9:
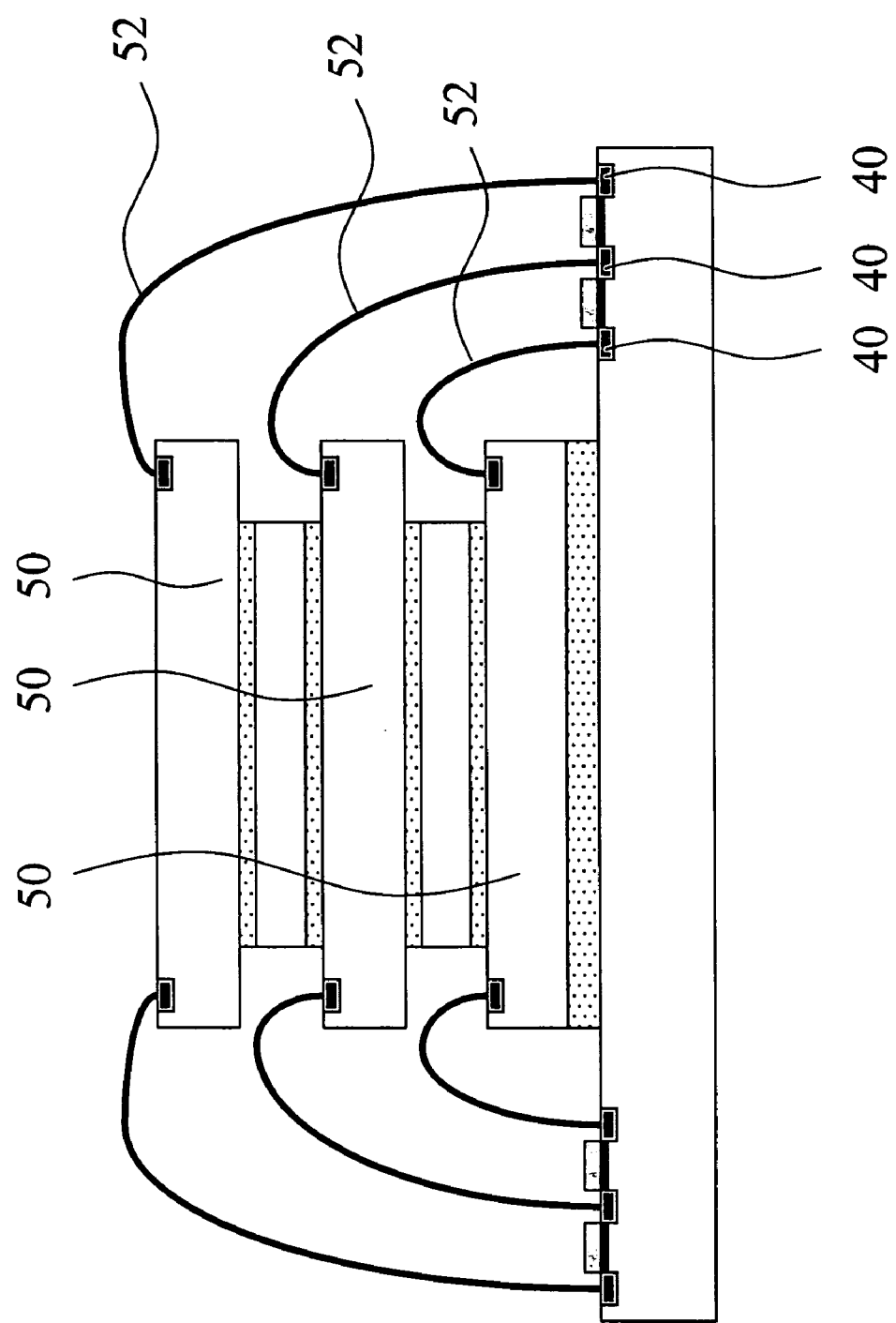

Furthermore, with reference to FIG. 9, the present invention can be further applied to the structure of multiple stacked-chip packaging. As shown in FIG. 9, the number of gold finger units 40 of each gold finger set is not less than the number of the chips 50. Thus, each wire 52 that can be directly connected to one another on each chip 50 can be connected to different gold finger units in the same gold finger set. In addition, when the present invention is applied to the structure of multiple stacked-chip packaging, on some part of the chips, the wires that can be directly connected to one another can be connected to the same gold finger unit, whereas on the other part of the chips, the wires that can be directly connected to one another can be separately connected to the other gold finger units. By doing so, the application of the present invention can be more flexible. Besides, the gold finger set of the present invention can also be a complete gold finger, and a solder resist layer is designed to cover some areas of the gold finger. Therefore, through the cover made by the solder resist layer, the complete gold finger can be divided into a plurality of gold finger units.

In sum, through the improvement made on the structure of gold fingers, the problems encountered in the prior art, including the adhesive's smearing the whole gold finger and the position shift of wire bonding, can be completely avoided.

The embodiments above are only intended to illustrate the present invention; they do not, however, to limit the present invention to the specific embodiments. Accordingly, various modifications and changes may be made without departing from the spirit and scope of the present invention as described in the following claims.

What is claimed is:

1. An improved structure of gold fingers, built in a stacked-chip packaging structure, and the stacked-chip packaging structure, comprising
    a packaging substrate;
    a plurality of chips stacked on said packaging substrate, each said chip including at least one chip wire; and
    a plurality of gold finger sets positioned on said packaging substrate, wherein each said gold finger set includes a plurality of gold finger units electrically connected to one another by a conductive material and positionally separated one from another by a solder resist structure extending above said conductive material, and wherein said at least one chip wires of said plurality of the stacked chips to be connected to one another are connected to said gold finger units of the same gold finger set, each said at least one chip wire being connected to a distinct gold finger unit.

2. The improved structure of gold fingers as claimed in claim 1, wherein the number of said gold finger units in each said gold finger set is equal or exceeds the number of said stacked chips.

3. The improved structure of gold fingers as claimed in claim 1, wherein said conductive material includes at least one connecting wire extending between respective gold finger units to form electrical connection therebetween.

4. The improved structure of gold fingers as claimed in claim 3, wherein said solder resister structure covers said at least one connecting wire.

5. The improved structure of gold fingers as claimed in claim 1, wherein said gold finger set is a complete gold finger, wherein said conductive material is a material of said complete gold finger, and wherein said solder resist structure covers a part of the surface of the complete gold finger to divide the latter into a plurality of said gold finger units.

* * * * *